United States Patent [19]

Kim et al.

[11] Patent Number: 4,752,741

[45] Date of Patent: Jun. 21, 1988

[54] NOISE EXTRACTION CIRCUIT

[75] Inventors: Suk K. Kim, Long Lake; Rosanne M. Hinz, Plymouth, both of Minn.

[73] Assignee: Honeywell Inc., Minneapolis, Minn.

[21] Appl. No.: 935,466

[22] Filed: Nov. 26, 1986

[51] Int. Cl.[4] .......................... H03K 5/00; H03K 1/10
[52] U.S. Cl. .................... 328/165; 307/520; 307/523; 455/305
[58] Field of Search ............... 328/165, 151; 455/284, 455/296, 305; 307/520, 522, 523

[56] References Cited

U.S. PATENT DOCUMENTS

| 3,793,599 | 2/1974 | Coor | 328/165 |
|---|---|---|---|
| 4,314,377 | 2/1982 | Kondo et al. | 455/305 |
| 4,532,442 | 7/1985 | Black | 307/520 |
| 4,536,666 | 8/1985 | Metz et al. | 307/520 |

Primary Examiner—Stanley D. Miller
Assistant Examiner—B. P. Davis
Attorney, Agent, or Firm—William T. Udseth

[57] ABSTRACT

A circuit receives either a composite voltage, which is the sum of a signal voltage and a noise voltage, or the noise voltage. A switching arrangement is used to charge a first capacitor to the composite voltage, and a second capacitor to the noise voltage. The opposite poles of the first and the second capacitors are connected after they are charged, to generate an output voltage which is proportional to the signal voltage alone.

8 Claims, 2 Drawing Sheets

NOISE EXTRACTION CIRCUIT

BACKGROUND OF THE INVENTION

1. Field of the Invention

This invention relates to circuits which extract nonrandom noise components from signals by charging a capacitor with a voltage representative of the noise and subtracting the voltage from the signal voltage.

2. Related Art

Certain electrical devices, and particularly image sensor arrays such as charge injection device (CID) arrays or HgCdTe sensor arrays, output voltages which include a signal component and a nonrandom, background noise component. The nonrandom background noise is due to leakage or a background signal.

More specifically, FIG. 1 depicts an electrical equivalent model of a typical sensor or detector which can be used with the present invention. The output voltage $V_1$ of detector D is passed to a preamplifier stage. The preamplifier stage will be discussed below with regard to the invention.

The signal voltage $V_s'$ from detector is generated in response to a change in voltage. Generally, there will be large ($C_{large}$) and small ($C_{small}$) capacitances associated with the detector D as shown, as well as leakage current $I_{leakage}$ which equals the noise current. Further, $V_1$ is either a composite of a signal voltage $V_s$ and a nonrandom, background noise voltage signal $V_n$ ($v_{noise}$), or $V_n$ alone. That is, $$V_1 = V_s + V_n \text{ or } V_n, \tag{1}$$

where $$V_s = \frac{C_{small}}{C_{large} + C_{small}} V_s' \simeq \frac{C_{small}}{C_{large}} V_s' \tag{2}$$

and $$V_n = \frac{I_{leakage} \times T}{C_{large} + C_{small}} \simeq \frac{I_{leakage} \times T}{C_{large}}, \tag{3}$$

where T=the time interval for sampling either $V_n$ only or $V_s + V_n$, (see FIG. 2 timing diagram).

In FIG. 2, the voltage $V_2$ is essentially $V_1$ after preamplification and passage through a buffer stage (see below for further disussion). $V_2$ includes $V_n$. The slanted line or droop in $V_2$ is $V_n$ due to $I_{leakage}$. Note that $V_s=0$ and $V_n=0$ in this example.

In general, it is very difficult to capture $V_s$ at t=0 (see $V_2$ in FIG. 2) due to the nonideal behavior of detector devices such as detector D, and electronic effects such as time delays and ringing. By the time $V_s$ is settled, $V_1$ contains the unwanted noise voltage component $V_n$.

In prior imaging systems, the noise problem has been approached by employing very accurate analog to digital convertors and filtering out the background noise which varies slowly compared to the signal. The need for high precision A/D convertors raises system requirements and system costs.

An effective means and method of extracting such nonrandom noise which eases system requirements is highly desirable, but heretofore undisclosed.

SUMMARY OF THE INVENTION

The present invention is a means and method of extracting nonrandom background noise from electrical devices which can selectively output either a composite voltage which includes both signal and noise components, or a noise component voltage alone.

The means for extracting the nonrandom noise component is characterized by two capacitors, which are separately charged by use of a switching arrangement. One capacitor is charged to voltage proportional to the composite voltage, and the other which is charged to a voltage proportional to the noise component. The capacitors are then placed in parallel with their polarities oppositely connected to produce an output voltage proportional to the signal voltage alone.

A method corresponding to the above circuit operation is also disclosed.

DESCRIPTION OF THE PREFERRED EMBODIMENT

Figure 3:
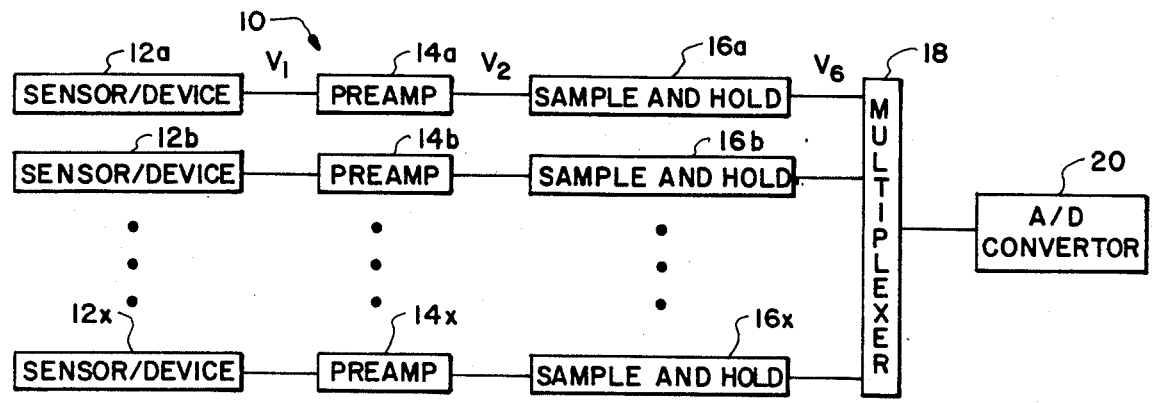
FIG. 3 is a block diagram of a typical system which could incorporate the present invention.

The system 10 of FIG. 3 includes an array of sensors (or devices) 12a, 12b . . . 12x which each outputs a voltage $V_1$, where $V_1$ is either a composite of a signal voltage $V_s$ and a nonrandom, background noise voltage signal $V_n$, or $V_n$ alone. Examples of sensor 12 are an InSb or a HgCdTe image sensor.

$V_1$ is passed through a preamplification stage (i.e., 14a, 14b . . . 14x) to reduce low frequency noise (i.e., 1/f noise). The output voltage of the preamplification stage is applied to sample and hold circuit (i.e., 16a, 16b . . . 16x) for output as $V_6$ to a multiplexer 18. Multiplexer 18 assembles the outputs from the parallel sensor lines to prepare for image construction. The output of multiplexer 18 is typically fed to A/D convertor 20 which provides an electrical digital pattern, which is representative of the image, to other electrical or electro-optical devices (not shown).

Figure 4:
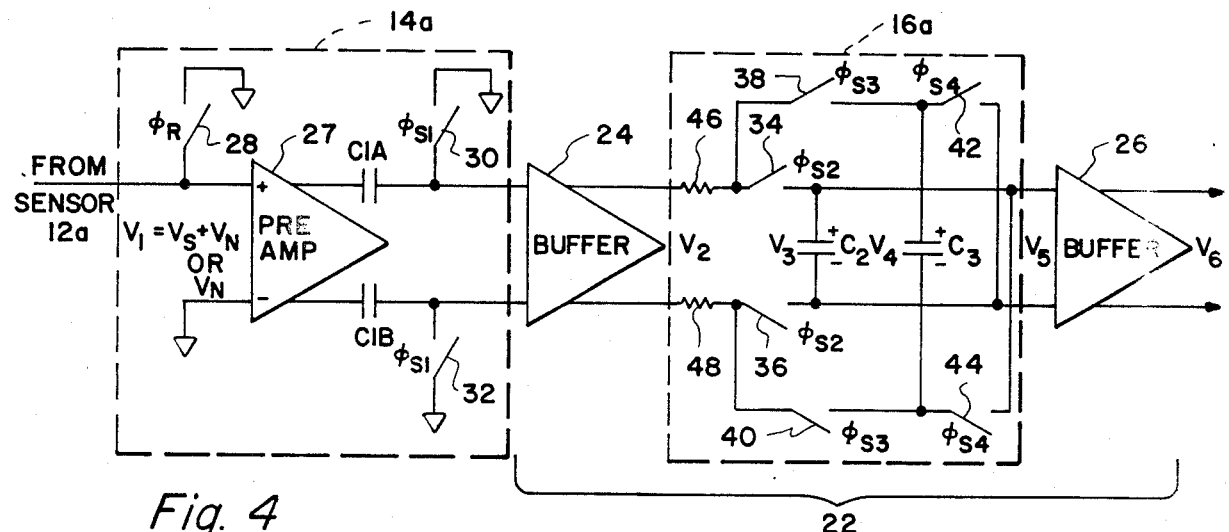
FIG. 4 is an electrical schematic of a first embodiment of the present invention.

The first embodiment (circuit 22) of the present invention is included in FIG. 4. Circuit 22 includes sample and hold 16a and "buffers" 24 and 26. Buffers 24 and 26 are each means for isolating the electrical impedance of sample and hold 16a from the preceding and subsequent electrical stages, respectively, of system 10. Further, buffers 24 and 26 provide voltages $V_2$ and $V_6$, respectively, which are proportional to the output of preamplifier 14a and the output of sample and hold 16a, respectively. Typically $V_2$ is equal in magnitude to the output of preamplifier 14a and $V_6$ is equal to or twice the magnitude of the output ($V_5$) of sample and hold 16a.

Preamplifier 14a represents a typical, standard stage, and includes amplifier 27 capacitors C1A and C1B, and switches 28, 30 and 32. Sample and hold 16a includes capacitors $C_2$ and $C_3$, and switches 34, 36, 38, 40, 42 and 44.

The operation of circuit 22 will be described with reference to the timing diagrams of FIG. 2.

Switches 28, 30 and 32 can be closed to ground the lines of preamplifier 14a to discharge the circuit prior to operation. Capacitors C1A and C1B effectively serve to block the slowly varying 1/f noise and any DC offset from sensor 12a.

Figure 1:
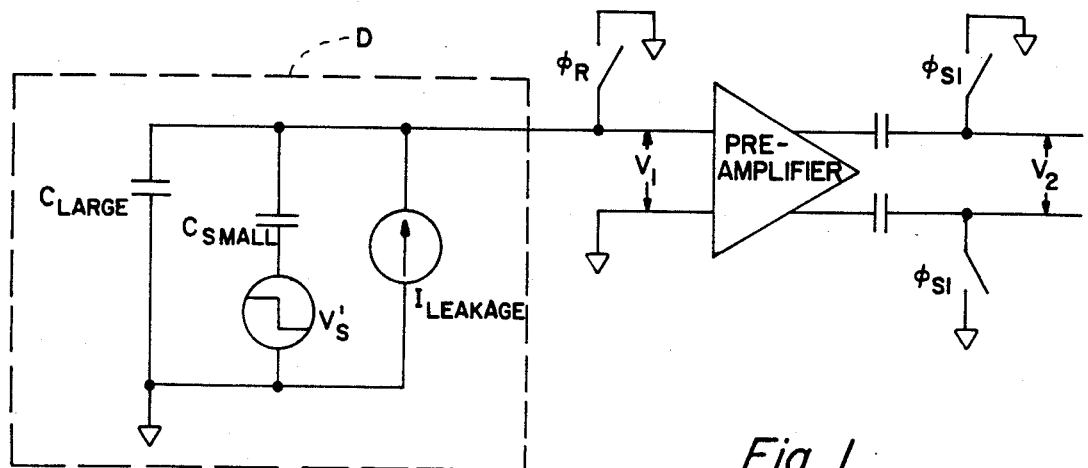
FIG. 1 is an electrical schematic of an electrical equivalent of a typical image sensor which could be used with the invention and a preamplification stage circuit.
Figure 2:
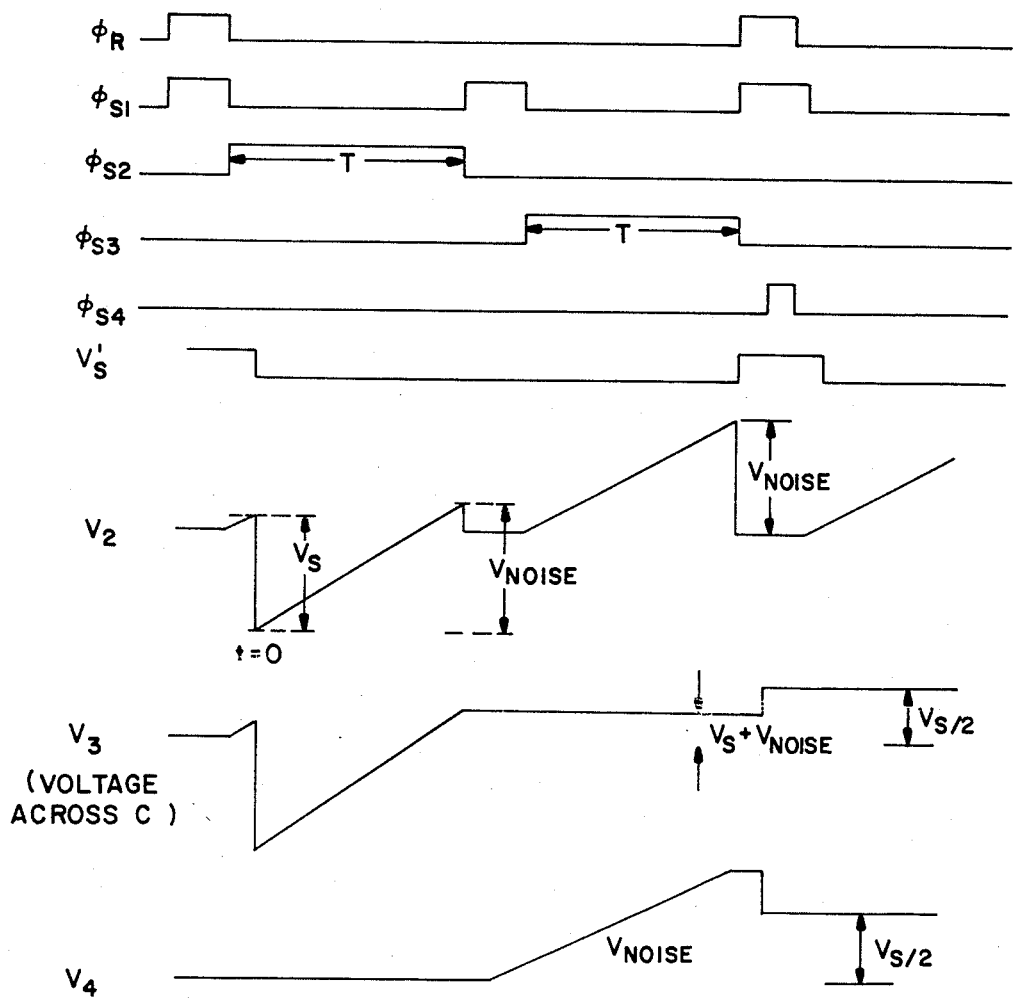
FIG. 2 is a timing diagram showing the operation of the circuits of FIGS. 1 and 4.

Preferably, the gain of the circuit of FIG. 2 is concentrated in preamplifier 14a because sample and hold 16a will subtract the noise component from preamplifier 14a, leaving only an amplified signal voltage as the input to buffer 24. The noise associated with sample and hold 16a itself, will be superimposed on the amplified signal voltage, but it will be neglible due to the prior amplification.

Sample and hold 16a operates by charging $C_2$ and $C_3$ independently. Either $C_2$ or $C_3$ can be charged first, but for illustrative purposes the circuit will be described with $C_2$ being charged first.

With $V_1 = V_s + V_n$ input to preamplifier 14a, switches 34 and 36 are closed, and switches 38 and 40 are opened. $C_2$ charges to $V_3$ with a fixed polarity. In this example $V_2 = V_3$. That is:

$$V_3 = \frac{Q_s + Q_n}{C_2} \quad (4)$$

where
$Q_s$ = charge associated with $V_s$,
$Q_n$ = charge associated with $V_n$.

Next, $V_1$ is set at $V_n$. Switches 34 and 36 are opened, switches 38 and 40 are closed, and switches 42 and 44 are opened. $C_3$ charges to $V_n$ with the same polarity as $C_2$. That is, $$V_4 = Q_n/C_3 \quad (5).$$

Switches 34, 36, 38 and 40 are now opened, and switches 42 and 44 closed. This places $C_2$ and $C_3$ in parallel with their oppositely poled plates connected. Thus, $$V_5 = \frac{Q_{total}}{C_{total}}, \text{ that is}$$

$$V_5 = \frac{Q_s + Q_n - Q_n}{C_2 + C_3} . \quad (6)$$

If $C_2 = C_3 = C$, then:

$$V_5 = \frac{V_s}{2} . \quad (7)$$

$V_6 = GV_5$, where G is the gain of buffer 26, and G may conveniently be set at 2 so that $V_6 = V_5$.

Circuit 22 is a differential circuit so most of the switch feed through will be cancelled out.

Resistance means 46 and 48 may be inserted in sample and hold 16a if one wishes to slow down buffer 24 and reduce noise in the bandwidth of circuit 22.

Figure 5:
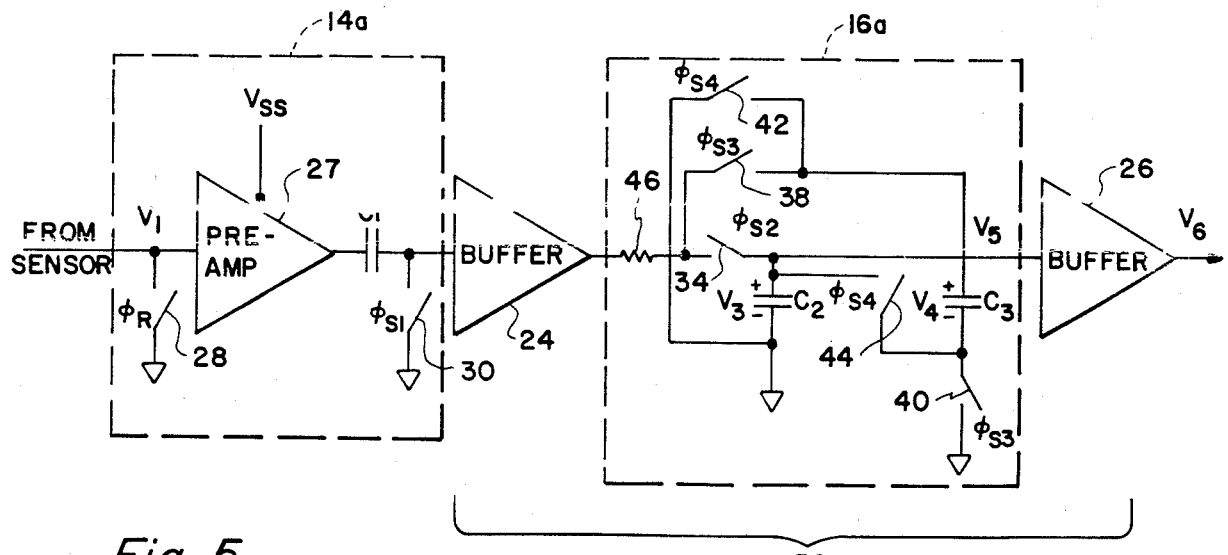
FIG. 5 is an electrical schematic of a second embodiment of the present invention.

FIG. 5 shows a single line embodiment 50 of the present invention. Corresponding components between circuit 22 and 50 are like numbered. The operation of circuits 22 and 50 is the same with single switches being closed now instead of pairs of switches. However, note that both pairs of switches 38 and 40, and 42 and 44, still operate as a pair in circuit 50.

Differential circuit 22, although larger and slightly more complex, is more resistant to fluctuations in the power supply, $V_{ss}$, of preamplifier 27 than is circuit 50.

Switches 34 and 36 may be described as a means for applying a voltage to $C_2$ as well as for disconnecting $C_2$ from buffer 24. Switches 38 and 40 may be described as a means for applying a voltage to $C_3$. Switches 34, 36, 38, 40, 42 and 44 may be described as a means for connecting the opposite poles of $C_2$ and $C_3$.

Switches 38 and 42 may be combined into one, double pole switch at the site of either switch 38 or switch 42. Similarly, switches 40 and 44 may be combined into one, double pole switch at the site of either switch 40 or switch 44.

What is claimed is:

1. An electrical circuit for extracting a nonrandom noise voltage component from a composite voltage, wherein said circuit has an impedance associated therewith, wherein said composite voltage is the sum of said nonrandom noise voltage and a signal voltage, wherein said composite voltage and said noise voltage can be generated separately and selectively by a device serving as an input mechanism to said circuit, and wherein said circuit can be connected between other electrical circuit stages, said circuit comprising:

first and second means for isolating said impedance of said electrical circuit from said other electrical circuit stages, and for generating an output voltage proportional to the magnitude of an input voltage, wherein each of said first and second means for isolating has an input and an output, and either said composite voltage ōr said noise voltage can be applied as said input voltage to said first means for isolating;

first and second capacitors;

means for selectively applying said output voltage of said first means for isolating across only said first capacitor when said output of said first means for isolating is proportional to the magnitude of said composite voltage, so that said first capcitor can be charged to a first voltage of a fixed polarity, said first voltage being proportional to the magnitude of said composite voltage;

means for selectively applying the output of said first means for isolating across only said second capacitor when said output of said first means for isolating is proportional to the magnitude of said noise voltage, so that said second capacitor can be charged to a second voltage of a fixed polarity, said second voltage being proportional to the magnitude of said noise voltage;

means for selectively connecting opposite poles of said first and said second capacitors after said first capacitor has been charged to said first voltage and said second capacitor has been charged to said second voltage, so that said connection of opposite poles of said first and said second capacitors generates a third voltage proportional to the magnitude of said signal voltage; and means for applying said third voltage as said input voltage to said second means for isolating, so that said output voltage of said second means for isolating is also proportional to the magnitude of said signal voltage.

2. The circuit of claim 1 wherein said first and said second means for isolating are buffer amplifiers.

3. The circuit of claim 1 wherein said first and said second capacitors are substantially equal in capacitance.

4. The circuit of claim 1 wherein said circuit further includes a voltage reference point, and each of said first and said second capacitors have one plate connected to said voltage reference point.

5. The circuit of claim 1 further including a resistive means, wherein said resistive means is connected between said output of said first means for isolating and said first capacitor.

6. The circuit of claim 1 wherein the magnitude of said output voltage of said second means for isolating is twice as large as the magnitude of said input voltage of said second means for isolating.

7. The circuit of claim 1 wherein said circuit further includes a voltage reference point, and neither said first nor said second capacitor can be connected to said voltage reference point without first passing through either said first or said second means for isolating.

8. A method of extracting a nonrandom noise voltage component from a composite voltage, wherein said composite voltage is the sum of said nonrandom noise voltage and signal voltage, wherein said composite voltage and said noise voltage can be generated separately and selectively by a device serving as an input mechanism to electrical means for extracting said nonrandom noise component, wherein said means for extracting said nonrandom noise component has an electrical impedance associated therewith and can be connected between other electrical circuit stages, said method comprising the steps of:

isolating said impedance of said means for extracting said nonrandom noise component from said other electrical circuit stages;

charging a first capacitor in said noise extracting means to a voltage of a fixed polarity which is proportional to the magnitude of said composite voltage;

charging a second capacitor in said noise extraction means to a voltage of a fixed polarity which is proportional to the magnitude of said noise voltage; and connecting opposite poles of said first and said second capacitors so that a voltage proportional to the magnitude of said signal voltage is generated.

* * * * *